United States Patent
Huang et al.

(10) Patent No.: US 9,379,032 B2
(45) Date of Patent: Jun. 28, 2016

(54) SEMICONDUCTOR PACKAGING HAVING WARPAGE CONTROL AND METHODS OF FORMING SAME

(71) Applicant: Taiwan Semiconductor Manufacturing Company, Ltd., Hsin-Chu (TW)

(72) Inventors: Yu-Chih Huang, Hsin-Chu (TW); Chun-Cheng Lin, New Taipei (TW); Kuei-Wei Huang, Hsin-Chu (TW); Yu-Feng Chen, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/486,813

(22) Filed: Sep. 15, 2014

(65) Prior Publication Data

US 2016/0079135 A1    Mar. 17, 2016

(51) Int. Cl.
*H01L 23/16* (2006.01)
*H01L 21/56* (2006.01)
*H01L 25/00* (2006.01)
*H01L 25/065* (2006.01)
*H01L 23/31* (2006.01)

(52) U.S. Cl.
CPC .............. *H01L 23/16* (2013.01); *H01L 21/563* (2013.01); *H01L 23/3157* (2013.01); *H01L 25/0652* (2013.01); *H01L 25/50* (2013.01)

(58) Field of Classification Search
CPC . H01L 21/563; H01L 21/68721; H01L 23/16; H01L 23/3157; H01L 25/0652; H01L 25/50
See application file for complete search history.

(56) References Cited

U.S. PATENT DOCUMENTS

| | | | |
|---|---|---|---|
| 2004/0084760 A1* | 5/2004 | Liu | H01L 24/29 257/686 |
| 2011/0147912 A1* | 6/2011 | Karpur | H01L 21/563 257/687 |
| 2013/0062783 A1* | 3/2013 | Lin | H01L 25/0655 257/777 |

* cited by examiner

*Primary Examiner* — Armando Rodriguez
(74) *Attorney, Agent, or Firm* — Slater Matsil, LLP

(57) ABSTRACT

An embodiment method for forming a semiconductor device package comprises bonding a first die to a package substrate and forming a molding compound over the package substrate and around the first die. A surface of the first die opposing the package substrate is exposed after forming the molding compound. The method further comprises bonding a plurality of second dies to the surface of the first die opposing the package substrate after forming the molding compound.

20 Claims, 10 Drawing Sheets

SEMICONDUCTOR PACKAGING HAVING WARPAGE CONTROL AND METHODS OF FORMING SAME

BACKGROUND

In the packaging of integrated circuits, device dies, which may be stacked vertically as well as horizontally, are packaged onto package substrates, which include conductive connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use organic materials such as materials that can be easily laminated. These materials, however, are prone to the warpage caused by the elevated temperatures used in the reflow of the solder. During the bonding process, since the dies and the package substrates may have different coefficients of thermal expansion (CTEs), the warpage in the device dies and the package substrates is worsened. The warpage in the package substrates may cause irregular joints and/or bump cracks. The warpage may be further worsened by the asymmetrical stacking of device dies over the package substrate causing an uneven distribution of joints and/or bumps. As a result, the yield of the packaging process is adversely affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
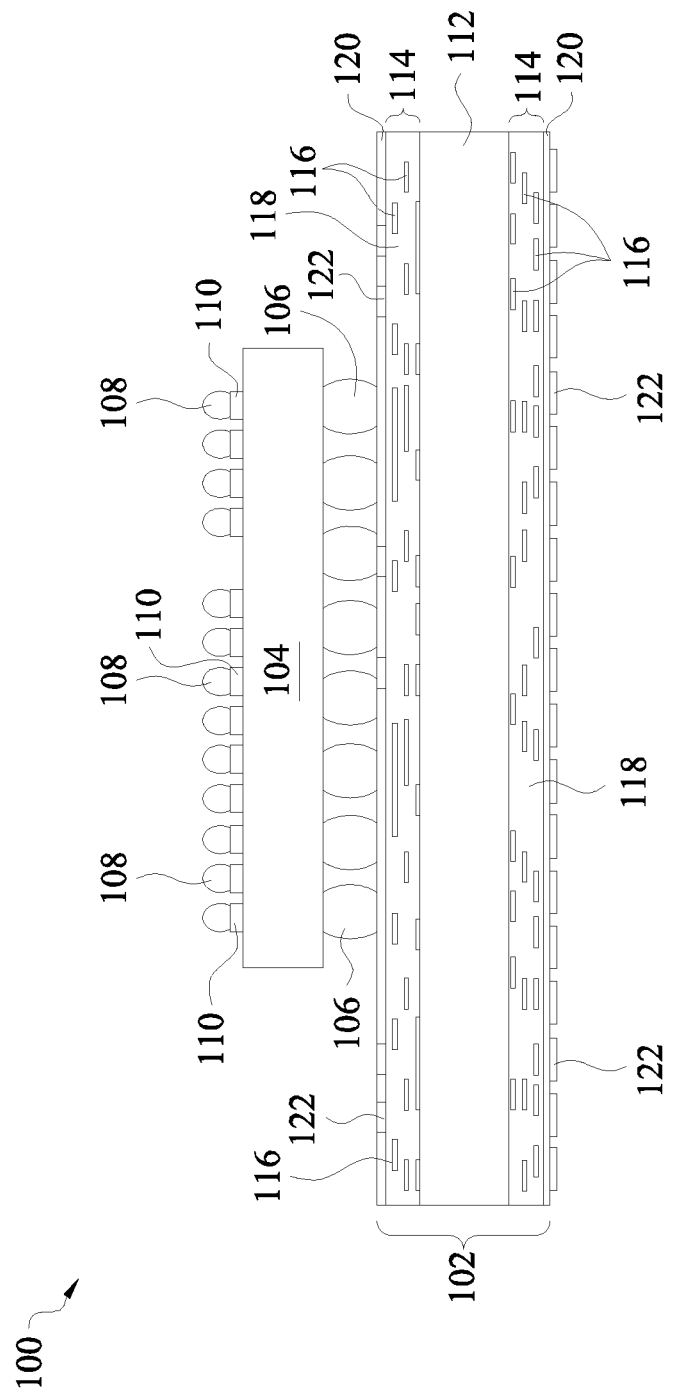
FIGS. 1 through 7 illustrate vary views of various intermediary stages of manufacturing a semiconductor device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described below relate to reducing warpage in packages formed using chip on chip on substrate (CoCoS) processes. In such CoCoS processes, a die (e.g., a semiconductor die or an interposer) is first bonded to a package substrate. Subsequently, a molding compound (e.g., a molded underfill) is formed over the package substrate and around the die. After molding, at least about 90% of a top surface of the substrate may be covered by the molding compound and/or die, improving rigidity in the package. Thus, warpage caused by the subsequent bonding of additional dies over the die may be reduced, improving package yield. A retaining ring may also be optionally attached to the package substrate to further reduce warpage by further increasing rigidity and/or reducing coefficient of thermal expansion (CTE) mismatch in the package.

FIGS. 1 through 7 illustrate cross-sectional and top down views of various intermediary stages of manufacturing a semiconductor package 100 in accordance with various embodiments. Referring first to FIG. 1, a cross-sectional view of a semiconductor package 100 is provided. Semiconductor package 100 includes a die 104 bonded (e.g., flip chip bonded) to a top surface of a package substrate 102.

In some embodiments, package substrate 102 is a build-up substrate that is built up from a core. In alternative embodiments, package substrate 102 is a laminate substrate that includes conductive traces embedded in laminated dielectric films. In the subsequent discussion of the embodiments of the present disclosure, a build-up substrate is illustrated as an example, while the teaching revealed in accordance with the example embodiments are readily applicable for laminate substrates.

In the embodiments that package substrate 102 is a build-up substrate, package substrate 102 includes core 112, and build up layers 114 on opposing sides of core 112. Core 112 may comprise a single-sided or double-sided copper clad laminate, epoxy, resin, glass fiber, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), combinations thereof, multilayers thereof, and the like. In some embodiments, conductive vias (not shown) may extend through the core 112 to provide electrical connection between build up layers 114 disposed on either side of core 112. Such conductive vias may be formed as conductive pipes in some embodiments, and the internal volumes of such conductive vias may be filled with a dielectric material and/or air gaps.

Among other components, the build-up layers 114 may comprise any number of dielectric layers 118 and metallization layers 116. Dielectric layers 118 may comprise a prepreg or ajinomoto build-up film (ABF). Alternatively, or additionally, dielectric layers may comprise paper, glass fiber, and/or non-woven glass fabric, one or more of which may be applied by lamination. Alternatively, or additionally, dielectric layers 118 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. Dielectric layers 118 may be formed by sputtering, spin-on coating, chemical vapor deposition (CVD), low-pressure CVD, rapid thermal CVD, atomic layer CVD, and/or plasma enhanced CVD, perhaps utilizing tetraethyl orthosilicate and oxygen as a precursor. Dielectric layers 118 may also be formed by an oxidation process, such as wet or dry thermal oxidation in an ambient environment comprising an oxide, water, nitric oxide, or a combination thereof, and/or other processes. Fabrication of dielectric layers 118 may also comprise chemical-mechanical polishing or planarizing (hereafter collectively referred to as CMP), isotropic etching, and/or anisotropic etching, among other processes.

The metallization layers 116 may comprise one or more of copper, titanium, aluminum, nickel, gold, alloys and/or combinations thereof, and/or other materials. Portions of metallization layers 116 may be vertically interconnected and may include various conductive pads, conductive lines, and/or conductive vias. Furthermore, contact pads 122 may be formed on top and bottom surfaces of package substrate 102 and provide electrical connection to various metallization layers 116, and a passivation layer 120 may be formed around such contact pads 122. In some embodiments, passivation layer 120 is patterned to expose at least portions of contact pads 122.

Die 104 is bonded contact pads 122 on a top side of package substrate 102 by a plurality of connectors 106 (e.g., ball grid array (BGA) balls, controlled collapse chip connector (C4) bumps, microbumps, or the like). In some embodiments, die 104—may be a semiconductor die and could be any type of integrated circuit, such as a processor, logic circuitry, memory, analog circuit, digital circuit, mixed signal, and the like. Die 104 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, CVD, and plasma-enhanced CVD. The interconnect structure electrically connect various active devices to form functional circuits within die 104. The functions provided by such circuits may include memory structures, processing structures, sensors, amplifiers, power distribution, input/output circuitry, or the like. The above examples are provided for illustrative purposes only to further explain applications of the present invention and are not meant to limit the present invention in any manner. Other circuitry may be used as appropriate for a given application.

Input/output (I/O) and passivation features (not separately illustrated) may be formed over the interconnect structure. For example, contact pads may be formed over the interconnect structure and may be electrically connected to the active devices through the various conductive features in the interconnect structure, and a passivation layer may be formed over the interconnect structure and the contact pads. Under bump metallurgies (UBMs) 110 may be formed on such contact pads, and connectors 108 (e.g., BGA balls, C4 bumps, microbumps, combinations thereof, and the like) may be formed on UBMs 110. Additionally, in embodiments where die 104 is a semiconductor die, connectors 106 may be formed on a backside of the substrate (e.g., the side of the substrate opposing a side having active devices formed thereon), and through vias may be formed in the substrate to provide electrical connection between connectors 106 and the interconnect structure of die 104. The various features of die 104 may be formed by any suitable method and are not described in further detail herein. Furthermore, the general features and configuration of die 104 described above are but one example embodiment, and die 104 may include any combination of any number of the above features as well as other features.

In alternative embodiments, die 104 may be an interposer having any suitable configuration. For example, in such embodiments, die 104 may comprise a silicon layer (either with or without filler materials) having conductive through vias (not illustrated) extending therethrough. Die 104 may further include an interconnect structure as described above with respect to a semiconductor die over the silicon layer. Connectors 106 and 108 may be electrically connected using the through vias and/or the interconnect structure within die 104.

Figure 2A:
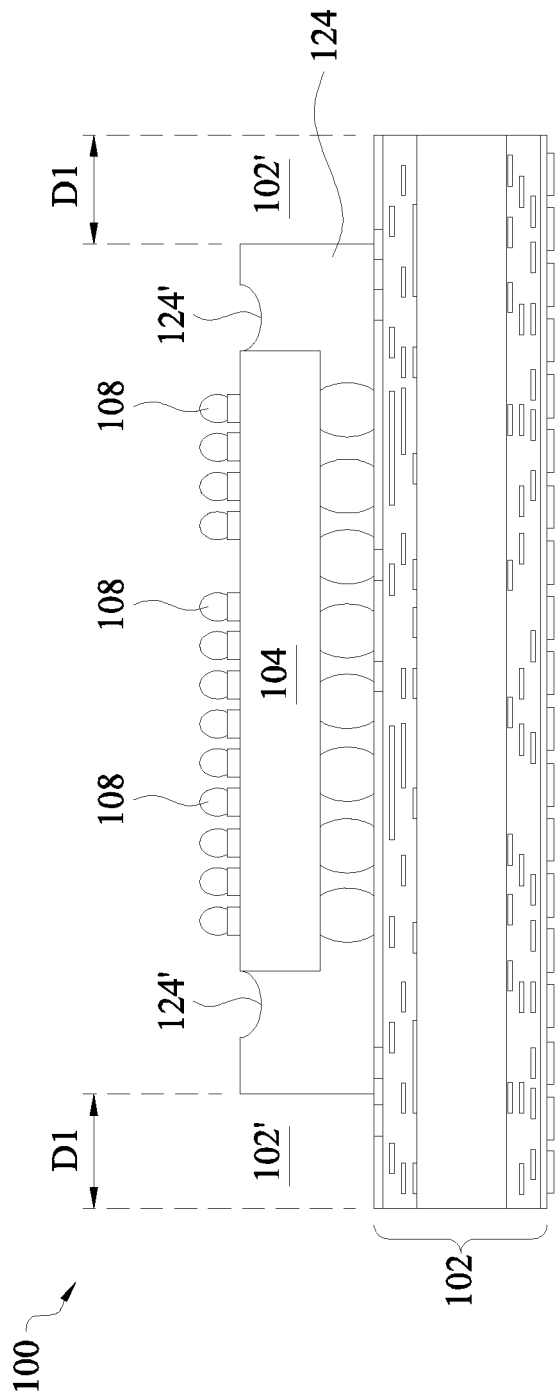
Figure 2B:
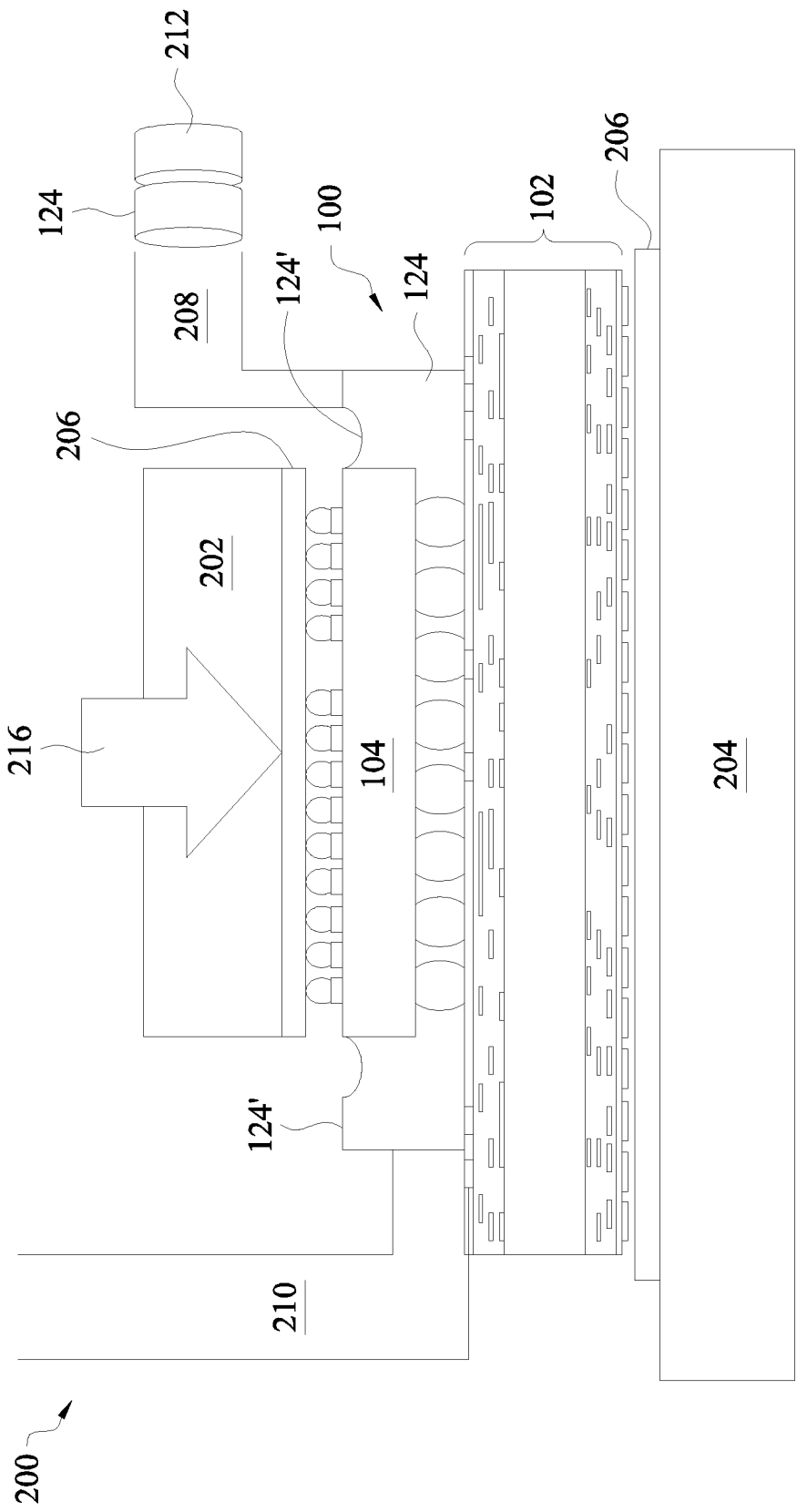

FIGS. 2A and 2B illustrate the formation of a molding compound 124 over package substrate 102 and around die 104. In some embodiments, molding compound 124 may be a molded underfill comprising a polymer material (e.g., epoxy, a resin, and the like) either with or without hardeners, fillers (e.g., silica filler, glass filler, aluminum oxide, silicon oxide, and the like), adhesion promoters, combinations thereof, and the like. In some embodiments, after molding, die 104 and molding compound 124 may cover about 90% to about 95%, or an ever greater percentage, of a top surface of package substrate 102. It has been observed that providing this amount of coverage over package substrate 102 improves the rigidity of semiconductor package 100 and reduces warpage during the attachment of additional dies to die 104 in subsequent process steps (e.g., as illustrated by FIG. 4). Furthermore, in some embodiments, after molding, a portion of package substrate 102 (e.g., portion 102' at an outer perimeter of package substrate 102) may remain exposed by molding compound 124. In a top down view of semiconductor package 100 (not illustrated), exposed portion 102' may encircle die 104 and molding compound 124. This exposed portion 102' of package substrate 102 may be sufficiently large to allow the attachment of a retaining ring (e.g., retaining ring 126 in FIG. 3) to package substrate 102 in subsequent process steps, which may further reduce warpage in semiconductor package 100 as will be explained in greater detail below. For example, a lateral dimension D1 of exposed portion 102' may be about 5 mm to accommodate a suitable retaining ring, although exposed portion 102' may have other dimensions in alternative embodiments.

Molding compound 124 may be formed using a suitable process, such as a transfer molding process, which may allow connectors 108 to remain exposed after molding. For example, FIG. 2B illustrates semiconductor package 100 within a molding apparatus 200, which may be used to form molding compound 124 using a transfer molding process according to an embodiment. Semiconductor package 100 may be disposed between a top mold chase 202 and a bottom mold chase 204 in molding apparatus 200. Top and bottom mold chases 202 and 204 may comprise a suitable material for providing structural support/pressure to semiconductor package 100 such as a metal, ceramic, or the like. Top and/or bottom mold chases 202 and 204 may be moved to cover features of semiconductor package 100 (e.g., connectors 108) as indicated by arrow 216 during the molding process, which may prevent the formation of molding compound 124 over such features of semiconductor package 100. Protective films 206 may be disposed between the mold chases and contact various features of semiconductor package 100. Protective films 206 protect such features from damage due to contact with top or bottom chases 202 and 204. In some embodiments, protective films 206 comprise rubber, polyethylene terephthalate (PET), teflon, or any other material that can be removed from semiconductor package 100 after molding.

Molding apparatus 200 may further includes an air vent 210 and a runner 208. During molding, a plunger 212 may be used to force molding compound 124 through runner 208 and dispense molding compound 124 over package substrate 102 into openings and recesses, eliminating air pockets or the like in molding compound 124. Air vent 210 may help control the pressure level in molding apparatus 200 while top and bottom mold chases 202 and 204 are in contact with semiconductor package 100. For example, air vent 210 may improve the vacuum level of molding apparatus 200 during the dispensing of molding compound 124, which may decrease the formation of air pockets in molding compound 124.

In some embodiments, the amount of area covered by molding compound 124 may be selected by controlling the amount of molding compound 124 dispensed by plunger 212. For example, the thickness of molding compound 124 can be controlled by the movement of plunger 212. In such embodiments, additional movement (e.g., plunging) of the plunger dispenses additional molding compound 124 (e.g., increasing the thickness of molding compound 124 formed over substrate 102) whereas less movement dispenses less molding compound 124 (e.g., decreasing the thickness of molding compound 124 formed over substrate 102). Subsequently, a curing may be performed to solidify molding compound 124, and semiconductor package 100 may be removed from molding apparatus 200. As a result of the molding process, a top surface 124' of molding compound 124 may be non-planar, especially in areas adjacent die 104.

Figure 3:
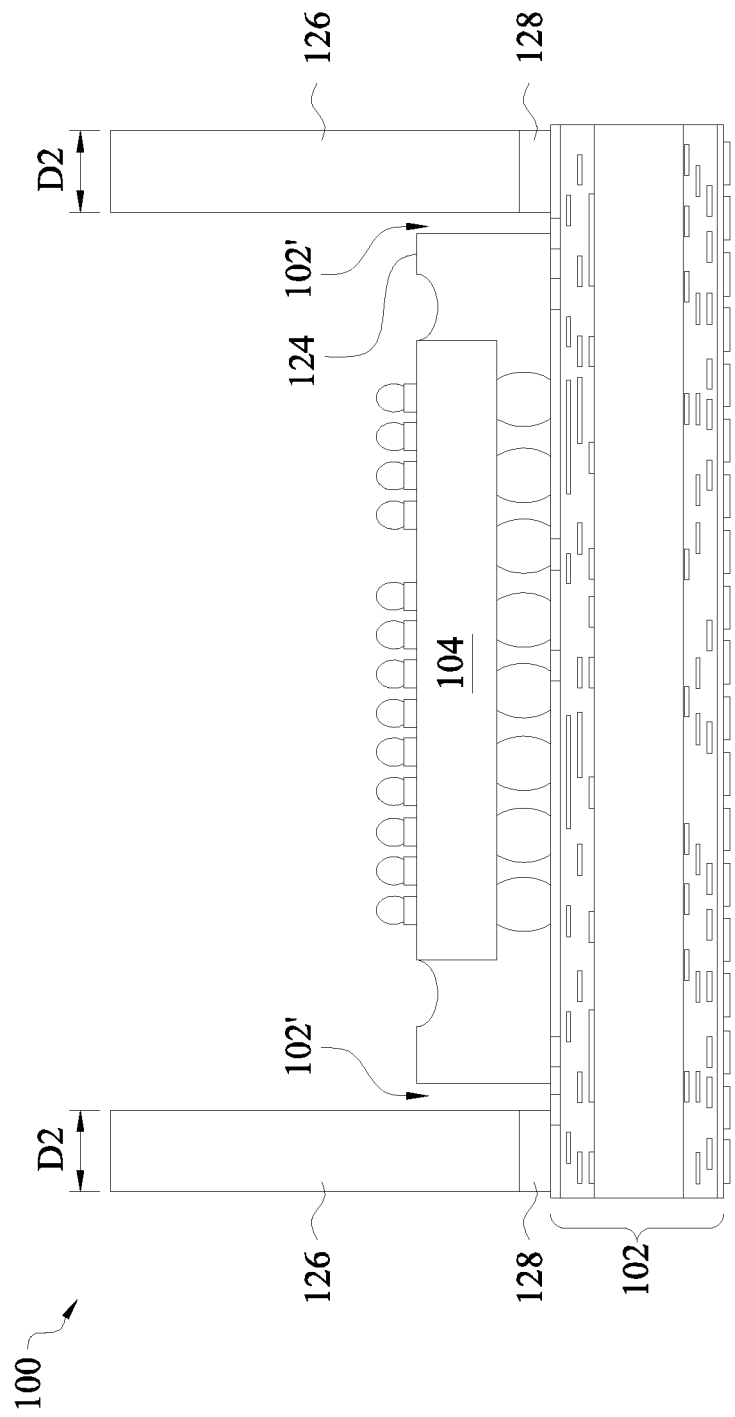
Figure 4:
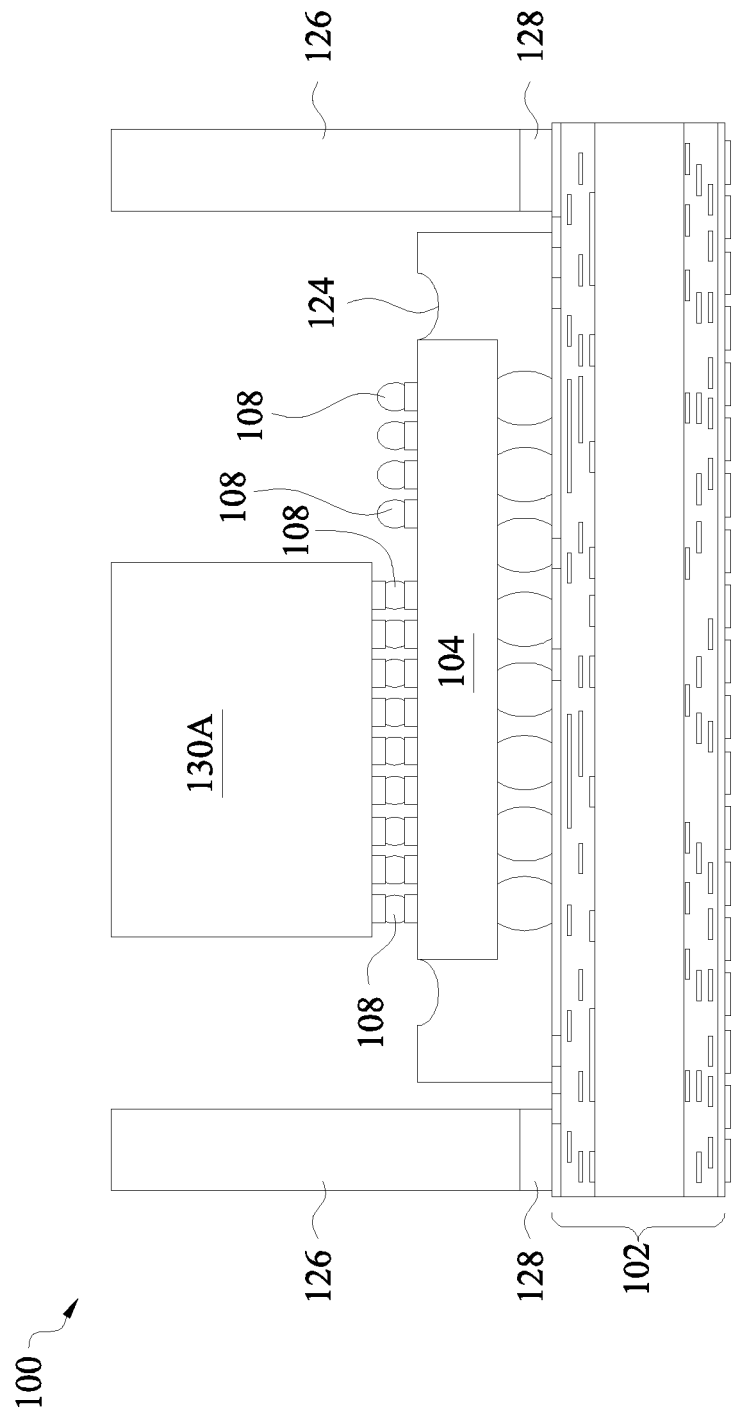

FIG. 3 illustrates the attachment of a retaining ring 126 to exposed portion 102' of package substrate 102. An adhesive 128 may be used to attach retaining ring 126 to package substrate 102. Retaining ring 126 may be attached to further reduce warpage in semiconductor package 100 during the subsequent bonding of additional dies over package substrate 102. For example, retaining ring 126 may comprise a suitably rigid material (e.g., a metal), which further increases the rigidity of semiconductor package 100. Furthermore, the silicon in die 104 may have a coefficient of thermal expansion (CTE) of 3.2 ppm/° C., while package substrate 102 may have a CTE of about 7.0 ppm/° C., or even higher. When retaining ring 126 comprises a metal (e.g., having a CTE of about 10 ppm/° C. to about 20 ppm/° C., or even higher), the overall CTE of features over package substrate 102 is increased, thus decreasing CTE mismatch in semiconductor package 100 and further reducing warpage.

Figure 5A:
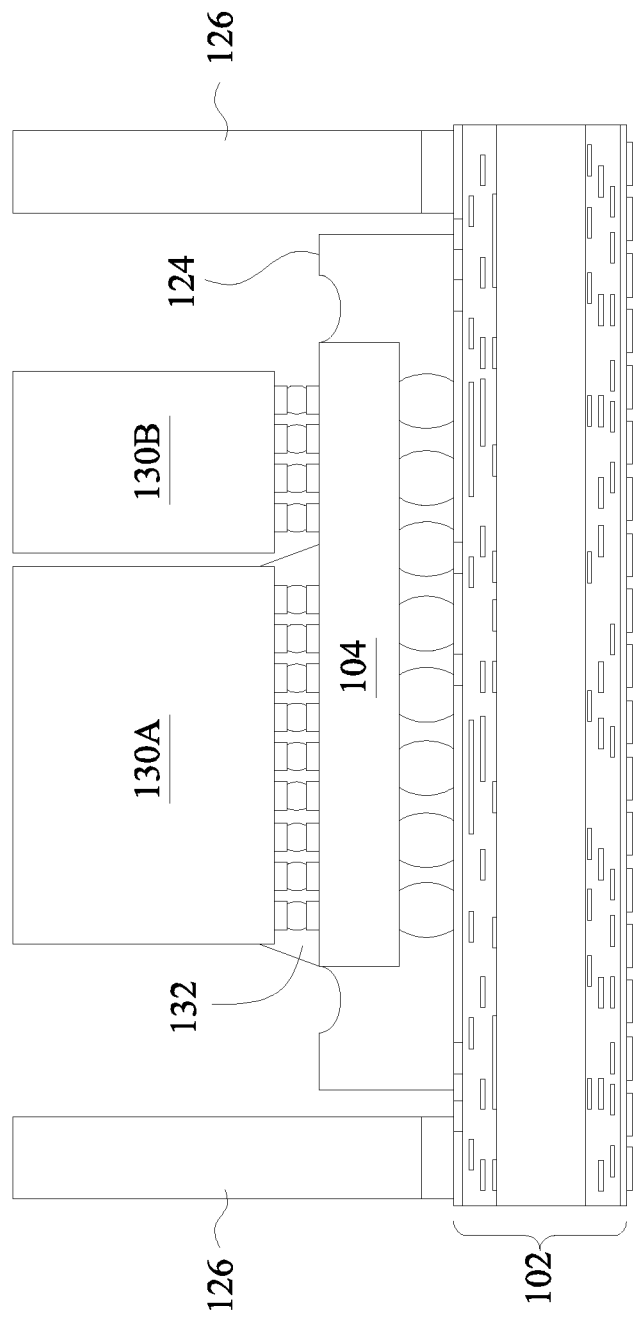
Figure 5B:
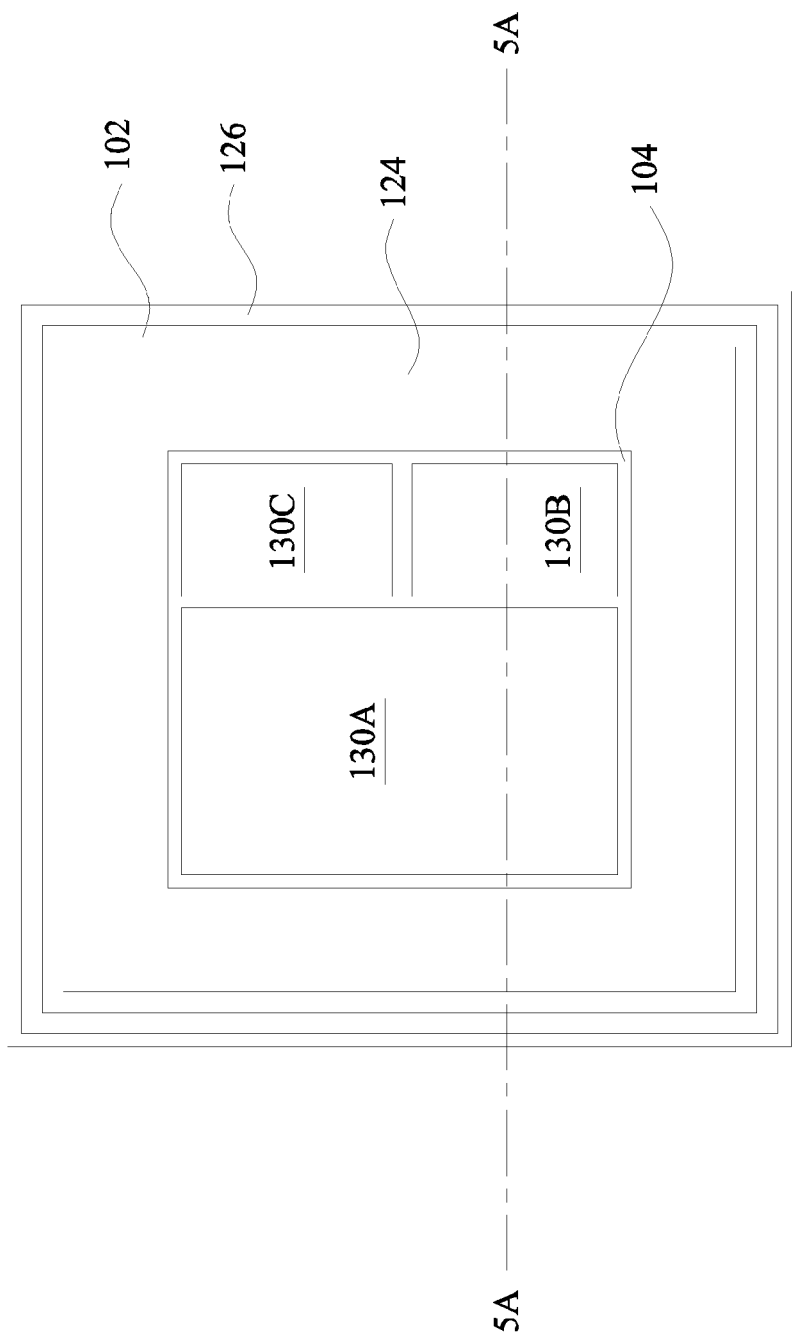

FIG. 4 illustrates a die 130A bonded (e.g., flip chip bonded) to a top surface of die 104 using a subset of connectors 108. In some embodiments, die 130A may be a semiconductor die and could be any type of integrated circuit, such as a processor, logic circuitry, memory, analog circuit, digital circuit, mixed signal, and the like. Die 130A may include a semiconductor substrate, active devices formed on the semiconductor substrate, interconnect structures electrically connecting the active devices to form functional circuits, and various I/O features similar to those described above. At least a portion of connectors 108 over die 104 may remain unused after the bonding of die 130A to allow for the attachment of additional dies in semiconductor package 100 (e.g., as illustrated by FIGS. 5A and 5B). As a result of molding compound 124 and/or retaining ring 126, warpage caused the bonding of die 130A to die 104 may be reduced.

Subsequently, an underfill 132 may be dispensed around connectors 108 used to bond die 130A to die 104 as illustrated by FIG. 5A. Underfill 132 may be included to provide structural support and protection to such connectors 108. FIGS. 5A and 5B further illustrate semiconductor package 100 after various additional semiconductor dies (e.g., dies 130B and 130C) are bonded to die 104. FIG. 5A illustrates a cross sectional view while FIG. 5B illustrates a top down view taken across line 5A/5A. In some embodiments, dies 130A, 130B, and 130C may be semiconductor dies and could be any type of integrated circuit, such as a processor, logic circuitry, memory, analog circuit, digital circuit, mixed signal, and the like. Dies 130B and 130C may include a semiconductor substrate, various active devices formed on the semiconductor substrate, interconnect structures electrically connecting the active devices to form functional circuits, and various I/O features similar to those described above. Dies 130A, 130B, and 130C may provide substantially similar or different integrated circuit functions. For example, in some embodiments, dies 130A, 130B, and 130C may be memory dies. In another embodiment, at least one die 130A, 130B, or 130C may be a logic die. Dies 130A, 130B, and 130C may be electrically connected to bottom die 104, which in some embodiments may also electrically connect dies 130A, 130B, and 130C to package substrate 102.

As illustrated by the top down view of semiconductor package 100 provided in FIG. 5B, dies 130A, 130B, and 130C may be disposed laterally across and bonded to a single bottom die 104 by connectors 108. In some embodiments, dies 130A, 130B, and 130C may be disposed in an asymmetrical fashion. For example, die 130A may occupy a larger lateral footprint than dies 130B or 130C and may extend laterally past a midpoint of bottom die 104. Warpage and defects caused by this asymmetrical design may be alleviated by the inclusion of molding compound 124 and/or retaining ring 126 in semiconductor package 100. Molding compound 124 and retaining ring 126 may encircle bottom die 104. Furthermore, the specific configuration of dies 130 provided by FIG. 5B is purely for ease of explanation. Other die configurations, having a greater or fewer number of dies, may also be used in alternative embodiments depending on package design.

Figure 6:
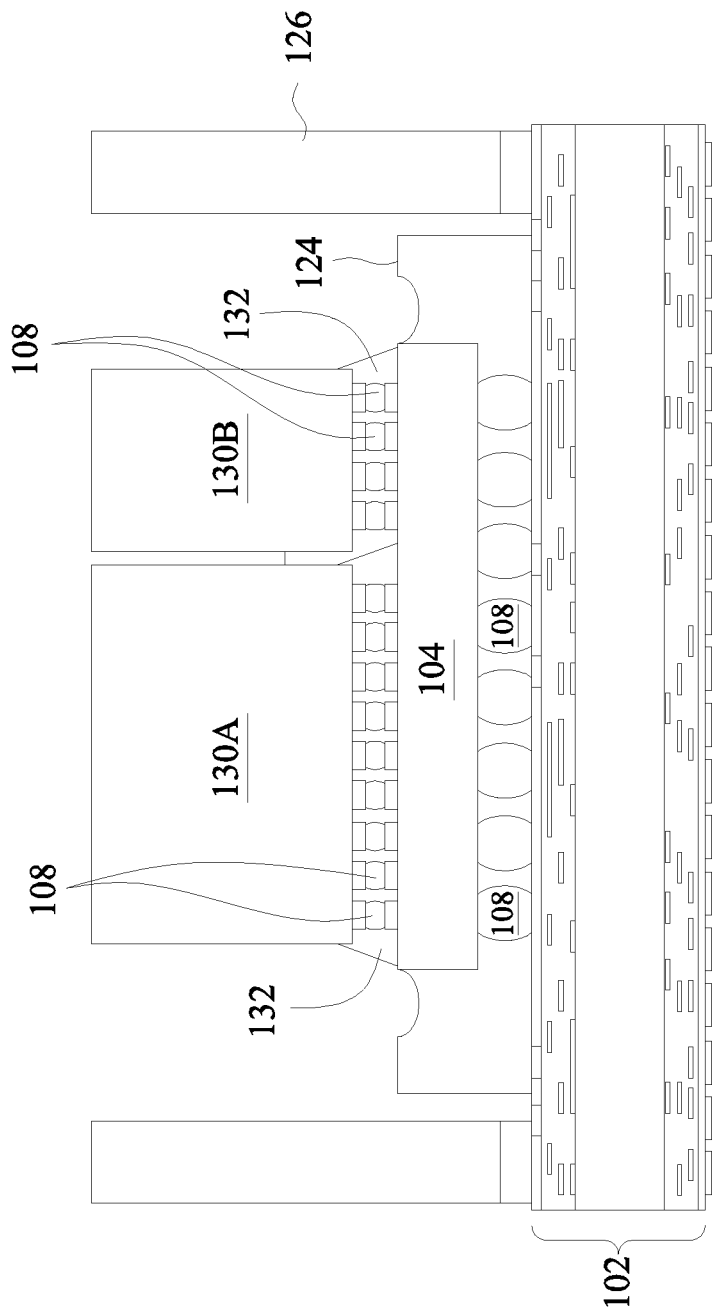
Figure 7:
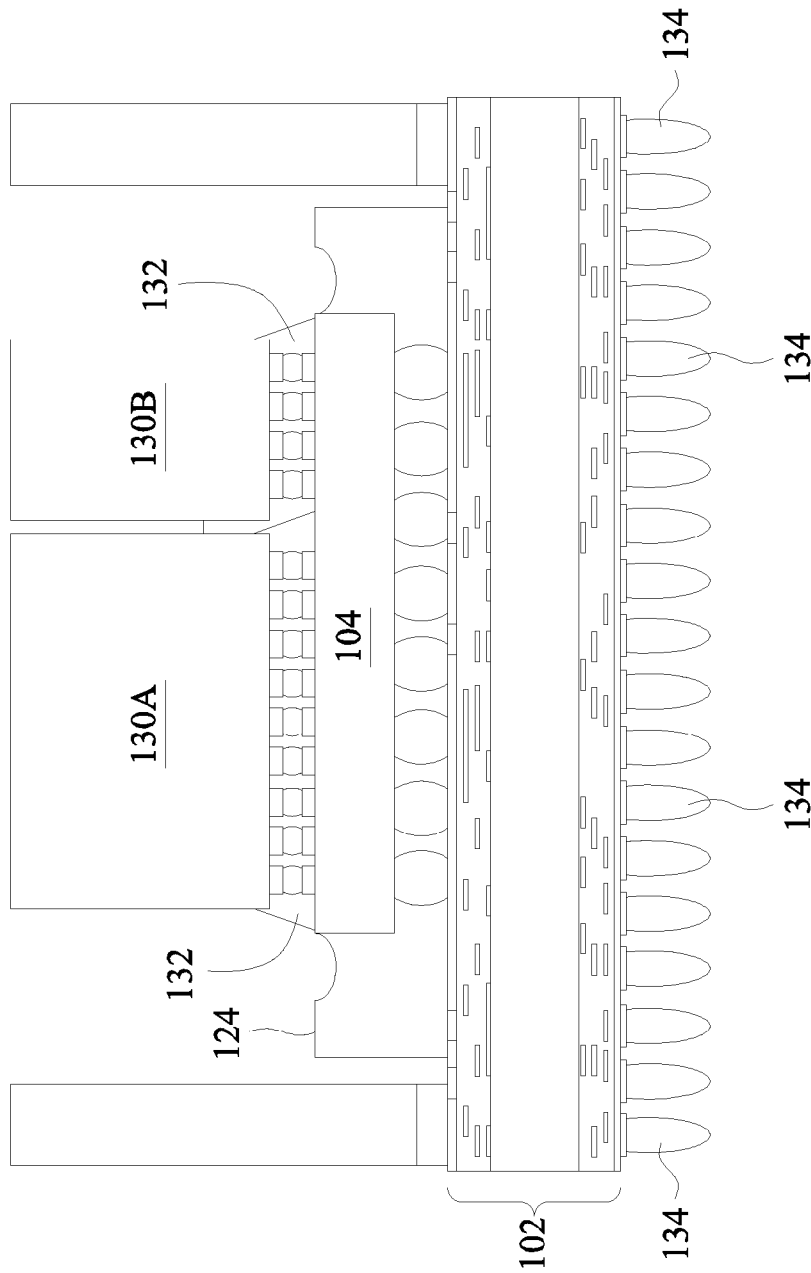

FIGS. 6 and 7 illustrate the formation of additional features in semiconductor package 100. In FIG. 6, additional underfill 132 may be dispensed around all connectors 108 (e.g., used to bond dies 130 to die 104) using any suitable method. In FIG. 7, external connectors 134 may be formed on an opposing surface of package substrate 102 as die 104. External connectors 134 may be electrically connected to die 104 and/or dies 130 by way of metallization layers in package substrate 102. Connectors 134 may be used to electrically connect semiconductor package 100 such as another device die, interposers, package substrates, printed circuit boards, a mother board, and the like. Other package features may also be included.

For example, one or more heat dissipation features may be provided. In some embodiments, a heat dissipating lid (not illustrated) and thermal interface material (TIM, not illustrated) may be attached over retaining ring 126 and/or dies 130. The TIM may comprise, for example, a polymer having a good thermal conductivity, which may be between about 3 watts per meter kelvin (W/m·K) to about 5 W/m·K or more. Furthermore, the heat dissipation lid may have a high thermal conductivity, for example, between about 200 W/m·K to about 400 W/m·K or more, and may be formed using a metal, a metal alloy, grapheme, carbon nanotubes (CNT), and the like. In such embodiments, retaining ring 126 may be used in combination with the TIM and heat dissipation lid to dissipate heat away from dies 104 and/or 130.

Figure 8:
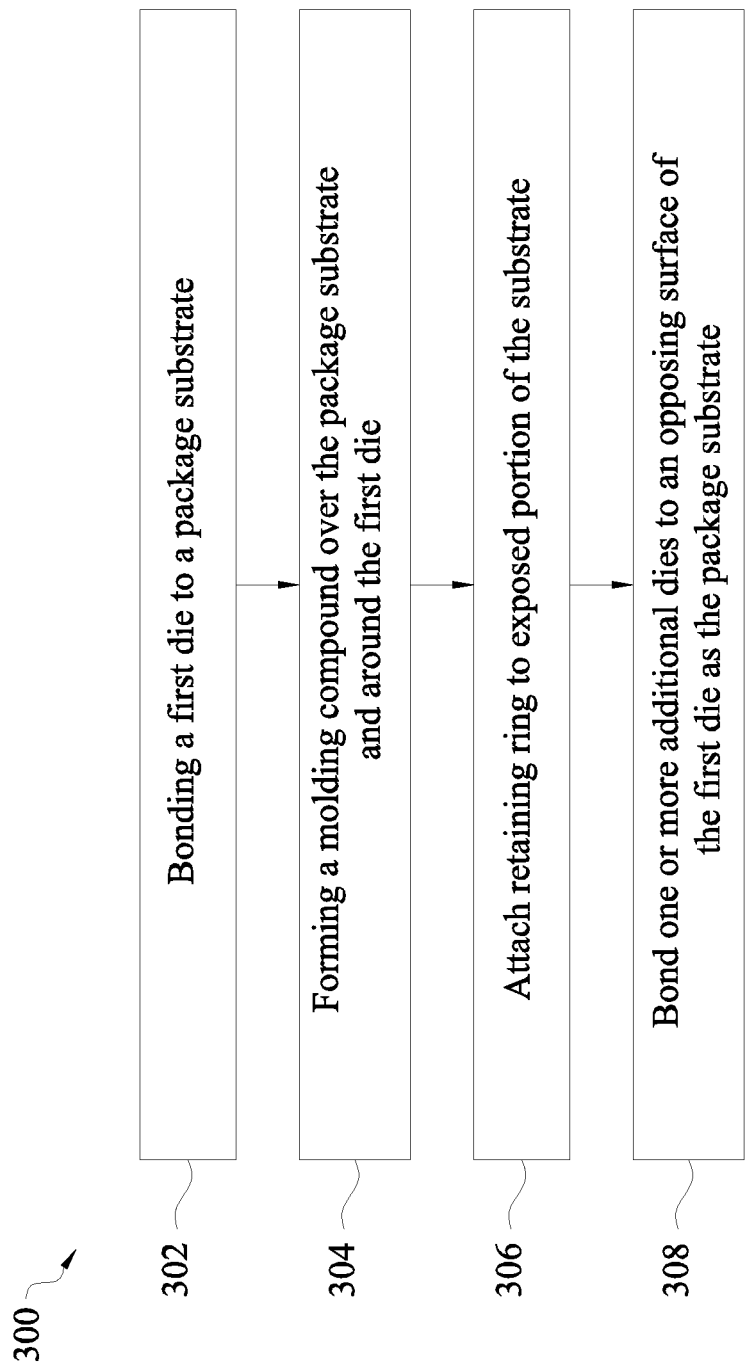
FIG. 8 illustrates a process flow for manufacturing a semiconductor device package in accordance with some embodiments.

FIG. 8 illustrates a process flow 300 for forming a device package in accordance with various embodiments. In step 302, a first die (e.g., die 104) may be bonded to a package substrate (e.g., package substrate 102) using a suitable process, such as flip chip bonding. In some embodiments, the first die may be a semiconductor die having active devices. In other embodiments, the first die may be an interposer having conductive vias extending through a substrate (e.g., a silicon substrate). In step 304, a molding compound (e.g., molding compound 124) is formed over the package substrate and around the first die. The formation of the molding compound may include a suitable process (e.g., transfer molding) that does not cover connectors at a top surface of the first die after molding. For example, the semiconductor package may be placed in a suitable molding apparatus (e.g., apparatus 200), and a top surface of the first die may be covered by a protective film (e.g., protective film 206) during molding to prevent the formation of a molding compound over a top surface of the first die. Furthermore, at least about 90% of a top surface of the package substrate may be covered after molding. However, a portion of the package substrate (e.g., exposed portion 102') may remain exposed even after molding.

In step 306, a retaining ring (e.g., retaining ring 126) may optionally be attached (e.g., using an adhesive layer) to an exposed portion of the package substrate. The inclusion of the molding compound and (optionally) the retaining ring improves rigidity and reduces CTE mismatch in the device package, thus decreasing warpage in subsequent process steps (e.g., bonding of additional dies in step 308). In the resulting device package, the molding compound and the retaining ring may encircle the first die. In step 308, one or more additional dies (e.g., dies 130) are bonded to an opposing surface of the first die as the package substrate. The additional dies may be disposed in any suitable configuration depending on package design, including asymmetrical configurations. Warpage caused by the bonding of additional designs may be reduced due to the molding compound and the retaining ring. Subsequently, additional package features such as underfills, external connectors, heat dissipation features, and the like may be formed in the device package. In some embodiments, the retaining ring may further be used as part of a heat dissipation feature for controlling heat generated by various dies in the device package.

Various embodiments as described above provide mechanisms for reducing warpage in packages formed using CoCoS processes, for example. A bottom die (e.g., a semiconductor die or an interposer) is first bonded to a package substrate, and a molding compound (e.g., a molded underfill) is formed over the package substrate and around the die using a transfer molding process, for example. As a result of the molding process, at least about 90% of a top surface of the substrate may be covered, increasing the rigidity in the package. Thus, warpage caused by the subsequent bonding of additional dies over the bottom die may be reduced, improving package yield. A retaining ring may also be optionally attached to the package substrate to further reduce warpage by further increasing rigidity and/or reducing CTE mismatch in the resulting device package.

In accordance with an embodiment, a method for forming a semiconductor device package comprises bonding a first die to a package substrate and forming a molding compound over the package substrate and around the first die. A surface of the first die opposing the package substrate is exposed after forming the molding compound. The method further comprises bonding a plurality of second dies to the surface of the first die opposing the package substrate after forming the molding compound.

In accordance with another embodiment, a method for forming a semiconductor device package comprises providing a first die. The first die includes a plurality of first connectors on a bottom surface of the first die and a plurality of second connectors on a top surface of the first die. The method further comprises bonding the first plurality of connectors to a top surface of a package substrate and forming a molding compound over the top surface of the package substrate. A portion of the top surface of the package substrate remains exposed after forming the molding compound. A retaining ring is attached to the portion of the top surface of the package substrate, and a plurality of second dies is bonded to the plurality of second connectors after attaching the retaining ring.

In accordance with yet another embodiment, a semiconductor device package includes package substrate and a first die bonded to a top surface of the package substrate. The semiconductor device package further includes a molding compound over the package substrate and extending along sidewalls of the first die and a plurality of second dies bonded to a top surface of the first die. The top surface of the first die is at least as high as a top surface of the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device package comprising:
   bonding a first die to a package substrate;
   forming a molding compound over the package substrate and around the first die, wherein a surface of the first die opposing the package substrate is exposed after forming the molding compound; and
   bonding a plurality of second dies to the surface of the first die opposing the package substrate using a plurality of connectors after forming the molding compound, the plurality of connectors electrically coupling the first die to the plurality of second dies.

2. The method of claim 1, wherein at least about 90 percent of a top surface of the package substrate is covered after forming the molding compound.

3. The method of claim 1, wherein a portion of a top surface of the package substrate remains exposed after forming the molding compound.

4. The method of claim 3, further comprising attaching a retaining ring to the portion of the top surface of the package substrate.

5. The method of claim 3, wherein the portion of the top surface of the package substrate encircles the first die and the molding compound.

6. The method of claim 1, wherein the molding compound is a molded underfill comprising an epoxy, a resin, a hardener, a filler, an adhesion promoter, or a combination thereof.

7. The method of claim 1, wherein forming the molding compound comprises a transfer molding process, and wherein the transfer molding process comprises covering the surface of the first die with a protective film while the molding compound is dispensed.

8. A method for forming a semiconductor device package comprising:
    providing a first die comprising:
        a plurality of first connectors on a bottom surface of the first die; and
        a plurality of second connectors on a top surface of the first die;
    bonding the first plurality of connectors to a top surface of a package substrate;
    forming a molding compound over the top surface of the package substrate, wherein a first portion of the top surface of the package substrate remains exposed after forming the molding compound, wherein the molding compound has a vertical sidewall, and wherein a thickness of the molding compound increases as the molding compound extends laterally away from a sidewall of the first die;
    attaching a retaining ring to the first portion of the top surface of the package substrate, wherein a second portion of the top surface of the package substrate is exposed through a gap between the vertical sidewall of the molding compound and a sidewall of the retaining ring; and
    bonding a plurality of second dies to the plurality of second connectors after attaching the retaining ring, the plurality of second connectors electrically coupling the first die to the plurality of second dies.

9. The method of claim 8, wherein at least about 90 percent of the top surface of the package substrate is covered after forming the molding compound.

10. The method of claim 8, wherein forming the molding compound comprises a transfer molding process, and wherein the plurality of second connectors remains exposed after the transfer molding process.

11. The method of claim 8 further comprising forming an underfill around the plurality of second connectors.

12. The method of claim 9, wherein the retaining ring encircles the molding compound.

13. A method comprising:
    forming a molding compound on a top surface of a package substrate, wherein the molding compound extends along sidewalls of a first die bonded to the top surface of the package substrate;
    after forming the molding compound, attaching a retaining ring to the top surface of the package substrate, wherein the molding compound does not extend between the retaining ring and the package substrate; and
    bonding a second die to an opposing surface of the first die as the package substrate using a plurality of connectors, the plurality of connectors being interposed between the first die and the second die, the plurality of connectors electrically coupling the first die to the second die.

14. The method of claim 13, wherein forming the molding compound comprises covering at least about 90 percent of the top surface of the package substrate.

15. The method of claim 13, wherein forming the molding compound comprises encircling the first die with the molding compound, and wherein the retaining ring encircles the molding compound.

16. The method of claim 13, wherein forming the molding compound comprises controlling an amount of the molding compound dispensed by a plunger.

17. The method of claim 16, wherein forming the molding compound further comprises selecting the amount of the molding compound dispensed in accordance with a desired coverage area of the molding compound and a desired thickness of the molding compound.

18. The method of claim 13 further comprising disposing a protective film on a top surface of the die while forming the molding compound.

19. The method of claim 13, wherein attaching the retaining ring comprises applying an adhesive to the top surface of the package substrate.

20. The method of claim 13, wherein the second die extends laterally past a midpoint of the top surface of the first die.

\* \* \* \* \*